United States Patent
Sueoka et al.

(10) Patent No.: US 9,409,702 B2
(45) Date of Patent: Aug. 9, 2016

(54) RECTANGULAR THIN PANEL CONVEYANCE UNIT

(75) Inventors: Masaaki Sueoka, Nishitokyo (JP); Yoshio Yamauchi, Osaka (JP)

(73) Assignee: KYORAKU CO., LTD., Kyoto (JP)

( * ) Notice: Subject to any disclaimer, the term of this patent is extended or adjusted under 35 U.S.C. 154(b) by 458 days.

(21) Appl. No.: 13/990,319

(22) PCT Filed: Nov. 29, 2011

(86) PCT No.: PCT/JP2011/006644
§ 371 (c)(1),
(2), (4) Date: Aug. 20, 2013

(87) PCT Pub. No.: WO2012/073482
PCT Pub. Date: Jun. 7, 2012

(65) Prior Publication Data
US 2013/0327669 A1   Dec. 12, 2013

(30) Foreign Application Priority Data
Nov. 29, 2010  (JP) .................................. 2010-265836

(51) Int. Cl.
*B65D 85/48* (2006.01)
*B65D 19/00* (2006.01)
(Continued)

(52) U.S. Cl.
CPC ............ *B65D 85/48* (2013.01); *B65D 19/0036* (2013.01); *B65D 57/00* (2013.01); *B65D 71/0096* (2013.01); *B65D 81/057* (2013.01); *B65D 81/107* (2013.01); *H01L 31/02* (2013.01);
(Continued)

(58) Field of Classification Search
CPC ........ B65D 85/48; B65D 19/36; B65D 19/44; B65D 19/385; B65D 19/40; B65D 19/0036; B65D 81/053; B65G 49/06; B65G 49/063; B65G 49/064; B65G 49/065
USPC ......... 206/453, 454, 449, 586, 585, 499, 597, 206/386, 598, 509, 448, 521, 391; 211/41.14
See application file for complete search history.

(56) References Cited

U.S. PATENT DOCUMENTS 2,738,564 A * 3/1956 Guinane ....................... 432/259
2,943,733 A * 7/1960 Poeschl et al. ................ 206/452
(Continued)

FOREIGN PATENT DOCUMENTS

JP   2006032978 A    2/2006
JP   2006264786 A   10/2006
(Continued)

*Primary Examiner* — Steven A. Reynolds
(74) *Attorney, Agent, or Firm* — Westerman, Hattori, Daniels & Adrian, LLP

(57) ABSTRACT

A rectangular thin panel conveyance unit includes a plurality of sets of four corner modules, and vibration suppressing bodies for rectangular thin panels in a fixed shape. The corner module has a support surface to support each corner portion of the rectangular thin panel from a lower side. At each corner portion, stacking the corner modules in a vertical direction stacks a plurality of rectangular thin panels in the vertical direction. The vibration suppressing bodies have a thickness equal to or less than the distance between the support surfaces of the corner modules vertically adjacent to one another; and are disposed on each of a top surface and an inferior surface of the rectangular thin panel such that the vibration suppressing body faces a planar portion of each rectangular thin panel to restrict vertical amplitude of vibration of the rectangular thin panel within a predetermined range.

15 Claims, 11 Drawing Sheets

(51) Int. Cl.
  *H01L 31/02*  (2006.01)
  *B65D 71/00*  (2006.01)
  *B65D 81/05*  (2006.01)
  *B65D 81/107* (2006.01)
  *B65D 57/00*  (2006.01)

(52) U.S. Cl.
  CPC ........... *B65D 2519/00034* (2013.01); *B65D 2519/00069* (2013.01); *B65D 2519/0081* (2013.01); *B65D 2519/00129* (2013.01); *B65D 2519/00273* (2013.01); *B65D 2519/00278* (2013.01); *B65D 2519/00288* (2013.01); *B65D 2519/00318* (2013.01); *B65D 2519/00348* (2013.01); *B65D 2519/00437* (2013.01); *B65D 2519/00562* (2013.01); *B65D 2519/00815* (2013.01); *B65D 2571/00043* (2013.01); *B65D 2571/00074* (2013.01); *B65D 2571/00117* (2013.01)

(56) References Cited

U.S. PATENT DOCUMENTS

| | | | | |
|---|---|---|---|---|
| 2,990,058 | A  * | 6/1961  | Williams | 206/599 |
| 3,348,673 | A  * | 10/1967 | Bahls et al. | 206/597 |
| 3,939,978 | A  * | 2/1976  | Thomaswick | 206/454 |
| 6,209,839 | B1 * | 4/2001  | O'Malley | 248/346.02 |
| 6,302,272 | B1 * | 10/2001 | Hata et al. | 206/451 |
| 2005/0109651 | A1* | 5/2005 | Fujimori | 206/454 |
| 2006/0005875 | A1 | 1/2006 | Haberlein | |
| 2006/0108249 | A1* | 5/2006 | Riddleburgh et al. | 206/453 |
| 2007/0131574 | A1 | 6/2007 | Aoki | |
| 2008/0164173 | A1* | 7/2008 | Savakus | 206/454 |
| 2014/0144752 | A1* | 5/2014 | Sueoka et al. | 198/463.1 |
| 2014/0367305 | A1* | 12/2014 | Mizuo et al. | 206/585 |

FOREIGN PATENT DOCUMENTS

| | | |
|---|---|---|
| JP | 2010120690 A | 6/2010 |
| JP | 2010120691 A | 6/2010 |

* cited by examiner

RECTANGULAR THIN PANEL CONVEYANCE UNIT

CROSS-REFERENCE TO RELATED APPLICATIONS

The present patent application is a nationalization of International application No. PCT/JP2011/006644, filed Nov. 29, 2011, which is based on, and claims priority from, Japanese Application No. 2010-265836, filed Nov. 29, 2010, both of which are incorporated herein by reference in their entireties.

TECHNICAL FIELD

The present invention relates to a rectangular thin panel conveyance unit. More specifically, the present invention relates to a rectangular thin panel conveyance unit that surely prevents damage or breakage of a plurality of rectangular thin panels while conveying the plurality of rectangular thin panels that are stacked so as not to contact one another.

BACKGROUND ART

Conventionally, a module for storing and conveying fragile and heavy rectangular thin panels such as solar panels that are stacked in the vertical direction so as not to contact one another has been used. Patent Document 1 discloses an example of this module.

This module includes a support surface and a molded member. The support surface supports a rectangular thin panel from the lower side. The molded member is coupled with the support surface, extends outward from the support surface, and transmits the weight of the rectangular thin panel in the vertical direction. The molded member includes a recess or a protrusion on each of the upper and the lower portions. The recess and the protrusion can fit each other. This module is placed at each of the four corners of the rectangular thin panel, which is supported by a rectangular-shaped annular outer frame at the peripheral edge. The rectangular thin panel is placed on each support surface of this module via the outer frame. Then, in each corner, the recess at the lower portion of the molded member in a new module is fitted to the protrusion at the upper portion of the molded member in a module that is already disposed. Similarly, the next rectangular thin panel is supported by four modules. Accordingly, the rectangular thin panels can be stacked in the vertical direction so as not to contact one another.

However, as for this module, in the case where the rectangular thin panel is conveyed with a pallet in a state where each of the four corners of the rectangular thin panel without the outer frame is placed on the support surface of this module, the following technical problem arises. The rectangular thin panel is at risk of damage or breakage during conveyance. More specifically, for example, in the case where stacked rectangular thin panels are transported by a motortruck, or in the case where a pallet runs over an uneven road surface, the rectangular thin panel vibrates and the maximum amplitude in the vertical direction occurs almost in the center of the rectangular thin panel. At this time, each corner portion of the rectangular thin panel, which is placed on the support surface of the module, is a free end. The amplitude in the center of the rectangular thin panel tends to be amplified more than the case where an outer frame makes each corner portion a fixed end. This vibration or collision with support portions above and below may cause damage of the rectangular thin panel and may lead to breakage of the rectangular thin panel in some cases. On the other hand, there are various forms of rectangular thin panels. Some rectangular thin panels are required to be conveyed in a state where they are stacked nakedly without any outer frame.

Patent Document 1: JP-A-2006-32978

DISCLOSURE OF THE INVENTION

Problems to be Solved by the Invention

In view of the technical problem described above, it is an object of the present invention to provide a rectangular thin panel conveyance unit that surely prevents damage or breakage of a plurality of rectangular thin panels while conveying the plurality of rectangular thin panels that are stacked so as not to contact one another.

Solutions to the Problems

To solve the problem described above, a rectangular thin panel conveyance unit according to the present invention is configured as follows.

A plurality of sets of four corner modules, which each have a support surface for supporting each corner portion of a rectangular thin panel from below, is disposed.

At each corner portion, stacking the corner modules in a columnar shape in the vertical direction stacks a plurality of rectangular thin panels in the vertical direction. At this time, a vibration suppressing body has the thickness that is equal to or less than the distance between an inferior surface of an upper rectangular thin panel and a top surface of a lower rectangular thin panel, as for the rectangular thin panels adjacent to each other in the vertical direction.

The vibration suppressing body for the rectangular thin panel in a fixed shape is disposed on each of the top surface and the inferior surface of the rectangular thin panel, facing the planar portion of each rectangular thin panel, in order to restrict amplitude of the vibration of the rectangular thin panel in the vertical direction, which is caused by conveyance of the plurality of stacked rectangular thin panels, within a predetermined range. The vibration suppressing body has a contact portion for the planar portion of the rectangular thin panel.

With the rectangular thin panel conveyance unit thus configured allows for conveyance of the plurality of stacked rectangular thin panels for each conveyance pallet by, for example, a forklift truck in the following manner. The set of the corner modules at the lowest position among the sets of four corner modules is placed, for example, on the top surface of the conveyance pallet. Each corner module supports the corner portion of the rectangular thin panel to be conveyed, from below. The corner modules are stacked in a columnar shape in the vertical direction at each corner portion. Accordingly, the plurality of rectangular thin panels is stacked in the vertical direction such that the weight of the plurality of rectangular thin panels is supported by the plurality of corner modules in the columnar shape.

Conveyance where, for example, a motortruck transports the plurality of stacked rectangular thin panels, or a forklift truck moves on an uneven road surface, causes vibration on the plurality of rectangular thin panels via the corner modules. The mode of the vibration has a bottom at the support portion of the rectangular thin panel, which is supported by the corner module, and a peak almost in the center of the rectangular thin panel. The vibration suppressing body for the rectangular thin panel in a fixed shape is disposed on each of the top surface and the inferior surface of each rectangular thin panel. The vibration suppressing body has the contact portion for the planar portion of the rectangular thin panel. This contact portion is disposed to face the planar portion of the rectangular thin panel in order to restrict the amplitude of the vibration in the vertical direction within the predetermined range. Accordingly, when the vibration occurs, the planar portion of the rectangular thin panel comes into contact with the contact portion and the amplitude almost in the center of the rectangular thin panel, which is the maximum amplitude, is restricted. This surely prevents damage or breakage of the rectangular thin panel during conveyance.

It is preferred to further include the conveyance pallet that has the top surface on which the sets of the corner modules at the lowest position rest. Additionally, it is preferred to include the following configuration. The vibration suppressing body is made of resin in an elongated shape and longer than the short side of the rectangular thin panel. A concave portion, which extends throughout the width direction of the vibration suppressing body, is disposed on the upper side or the lower side of each end portion, while a convex portion, which extends throughout the width direction of the vibration suppressing body and has a shape complementary to the recess, is disposed on the lower side or the upper side of each end portion. Fitting the concave portion or the convex portion of the upper vibration suppressing body to the convex portion or the concave portion of the lower vibration suppressing body preferably restricts movement of the upper vibration suppressing body in the longer side direction, relative to the lower vibration suppressing body. Additionally, it is also preferred that the vibration suppressing body be disposed in parallel with the short side direction at the center position of the long side of the rectangular thin panel such that the concave portion or the convex portion at each end portion of the vibration suppressing body projects outward from the edge of the corresponding long side of the rectangular thin panel.

Additionally, it is preferred that the vibration suppressing bodies be stacked such that a predetermined clearance is provided between the planar portion of the rectangular thin panel supported by the corner module from below at each corner portion and the contact portion of the vibration suppressing body. Additionally, it is preferred that the rectangular thin panel be a solar panel, and the predetermined clearance be equal to or less than 5 mm. Additionally, it is also preferred that the support surface support the corner portion of the rectangular thin panel as a free end, the contact portion of the vibration suppressing body, which faces the inferior surface of the rectangular thin panel supported by the corner module from below at each corner portion, form an abutment surface, which comes into abutment with the inferior surface of the rectangular thin panel, and the contact portion be disposed so as to be flush with the support surface. Additionally, it is preferred that a concave portion, which faces outward in the longitudinal direction, be disposed at each end portion of the vibration suppressing body across the thickness direction of the vibration suppressing body in order to restrict relative movement of the upper vibration suppressing body in the width direction relative to the lower vibration suppressing body, by stretching a band in the concave portions of the stacked vibration suppressing bodies in a C shape when the vibration suppressing bodies are stacked in the vertical direction.

Additionally, it is preferred that the width of the vibration suppressing body be determined depending on a proportion of the supported area of the rectangular thin panel, which is supported by the set of the corner modules, to the area of the planar portion of the rectangular thin panel, the weight of the rectangular thin panel, and the configuration where the rectangular thin panel is supported by the corner modules.

Additionally, it is also preferred that a recess, which extends across the thickness direction, be disposed at a predetermined position in the longitudinal direction on one of side surface portions of the vibration suppressing body in order to avoid a power distribution box and/or a cord that are attached to the stacked solar panels.

Additionally, it is preferred that the vibration suppressing body be solid and made of foamed resin, which is integrally molded, with a plurality of through-holes, which extends in the thickness direction, and have an expansion ratio that is large enough so as not to crack the rectangular thin panel when the rectangular thin panel comes into contact with the vibration suppressing body due to vibration.

Additionally, it is preferred that the vibration suppressing body is constituted by a pair of thermoplastic resin plates, a side peripheral surface be formed and a hermetic hollow portion be configured inside by bonding both peripheral edge portions of the pair of thermoplastic resin plates together, the pair of thermoplastic resin plates each have a plurality of recesses, which is tapered inward while projecting at the inner surface side, on the outer surface, the plurality of recesses each have a butt planar portion in the thinnest end portion, an annular rib, which extends between a pair of resin-made plates, be formed by butt welding such that the planar portion of each of the recesses of one of the pair of resin-made plates is welded to the planer portion of the corresponding recess of the other of the pair of resin-made plates in a back-to-back manner, and the number and/or the thickness of the annular rib be large enough so as not to crack the rectangular thin panel when the rectangular thin panel comes into contact with the vibration suppressing body due to vibration.

Additionally, it is preferred that the vibration suppressing body have the thickness that is equal to the distance between the inferior surface of an upper rectangular thin panel and the top surface of a lower rectangular thin panel, the contact portion on the upper side of the vibration suppressing body is in abutment with the inferior surface of the upper rectangular thin panel, and the contact portion on the lower side of the vibration suppressing body is in abutment with the top surface of the lower rectangular thin panel.

To solve the problem described above, a rectangular thin panel conveyance unit according to the present invention is configured as follows. A plurality of sets of a plurality of corner modules, which has a support surface that supports each corner portion of a rectangular thin panel from below, is disposed.

At each corner portion, stacking the corner modules in a columnar shape in the vertical direction stacks the plurality of rectangular thin panels in the vertical direction. At this time, the vibration suppressing body for the rectangular thin panel in a fixed shape is disposed on each of the top surface and the inferior surface of the rectangular thin panel such that the vibration suppressing body projects outward from the edge of the long side of the rectangular thin panel, to restrict amplitude of vibration of the rectangular thin panel in the vertical direction, which is caused by conveyance of a plurality of stacked rectangular thin panels, within a predetermined range. The vibration suppressing body for the rectangular thin panel in a fixed shape has a contact portion for the rectangular thin panel.

A recess, which faces outward, is disposed on an outer surface of the vibration suppressing body, which projects outward, across the thickness direction of the vibration suppressing body, to restrict relative movement of the upper vibration suppressing body in the width direction relative to the lower vibration suppressing body, by stretching a band using the recesses of the stacked vibration suppressing bodies when the vibration suppressing bodies are stacked in the vertical direction.

To solve the problem described above, a rectangular thin panel conveyance unit according to the present invention is configured as follows. A plurality of sets of a plurality of corner modules, which each have a support surface for supporting each corner portion of a rectangular thin panel from below, is disposed.

At each corner portion, stacking the corner modules in a columnar shape in the vertical direction stacks the plurality of rectangular thin panels in the vertical direction. At this time, the vibration suppressing body has the thickness that is equal to or less than the distance between an inferior surface of an upper rectangular thin panel and a top surface of a lower rectangular thin panel, as for the rectangular thin panels adjacent to each other in the vertical direction. The vibration suppressing body for the rectangular thin panel in a fixed shape is disposed on each of the top surface and the inferior surface of the rectangular thin panel to restrict amplitude of vibration of the rectangular thin panel in the vertical direction, which is caused by conveyance of a plurality of stacked rectangular thin panels, within a predetermined range. The vibration suppressing body has a contact portion for the rectangular thin panel. The vibration suppressing body is made of foamed resin, and has an expansion ratio that is large enough so as not to crack the rectangular thin panel due to the vibration of the rectangular thin panel.

To solve the problem described above, a rectangular thin panel conveyance unit according to the present invention is configured as follows. A plurality of sets of a plurality of corner modules, which each have a support surface for supporting each corner portion of a rectangular thin panel from below, is disposed. The vibration suppressing body for the rectangular thin panel in a fixed shape is disposed on each of the top surface and the inferior surface of the rectangular thin panel to restrict amplitude of vibration of the rectangular thin panel in the vertical direction, which is caused by conveyance of a plurality of stacked rectangular thin panels, within a predetermined range when the corner modules are stacked in a columnar shape in the vertical direction at each corner portion such that a plurality of rectangular thin panels is stacked in the vertical direction. The vibration suppressing body for the rectangular thin panel in a fixed shape has a contact portion for the rectangular thin panel. The vibration suppressing body is made of foamed resin, and is stacked in the vertical direction. The contact portion faces the rectangular thin panel so as to be flush with the support surface of the corresponding corner module.

BEST MODE FOR CARRYING OUT THE INVENTION

With an example of the solar panels P as the stacked rectangular thin panels, a thin panel conveyance unit according to an embodiment of the present invention will be described in detail below with reference to the accompanying drawings. The solar panel P includes series-connected cells and is in a form of a thin plate, which is protected by resin, reinforced glass, and a metal frame. More specifically, the solar panel P has a laminated structure where the cell made of silicon is implanted between a glass layer and a plastic layer, or between glass layers. The solar panel P has the thickness of few millimeters, the area of a few square meters, and the weight of 10 to 30 kg. Thus, the solar panel P has a precise and fragile structure.

In this embodiment, a description will be given on the case where the respective four corners of the solar panel P are directly supported by a resin-made corner module. As illustrated in FIG. 1 and FIG. 2, a conveyance unit 10 for the solar panel P includes a resin-made pallet 200, a metal frame 202, a resin-made corner module 100, and a vibration suppressing body 300. The resin-made pallet 200 can be conveyed by a forklift truck or a hand pallet truck (not shown). The metal frame 202 is disposed on a top surface 201 of the resin-made pallet 200. The resin-made corner module 100 is placed on the top surface 201 of the resin-made pallet 200 via the metal frame 202 at the respective four corners of the solar panel P to be stacked. The vibration suppressing body 300 is disposed on the top surface and the inferior surface of each solar panel P.

As illustrated in FIG. 2 to FIG. 4, the resin-made pallet 200 includes a resin-made first plate 102 and a resin-made second plate 104, which faces the resin-made first plate 102. Welding of respective peripheral edge portions of the resin-made first plate 102 and the resin-made second plate 104 forms a side peripheral surface 106, which forms a hollow portion 108 inside. The resin-made first plate 102 and the resin-made second plate 104 have a rectangle shape, and a fork can be inserted into both the short side direction and the long side direction. As described later, a pair of fork insertion openings 114 is formed on each of the four side peripheral surfaces 106 such that the fork can be inserted into forward and backward in each direction. This allows the fork to be inserted into a fork insertion space 116, which is formed in the hollow portion 108.

The pallet P includes a resin material of thermoplastic resin that includes amorphous resin, olefin-based resin such as polyethylene and polypropylene, and a similar material. More specifically, the pallet P includes polyolefin (such as polypropylene and high density polyethylene), which is a homopolymer or a copolymer of olefin such as ethylene, propylene, butene, isoprene pentene, and methyl pentene.

As illustrated in FIG. 2 and FIG. 3, each of the pair of the fork insertion openings 114 is disposed on each of the pair of opposing surfaces of the side peripheral surface 106 at predetermined intervals according to specifications of a forklift truck. The fork insertion space 116 is formed inside the hollow portion 108 such that it is associated with the fork insertion opening 114. As illustrated in FIG. 2, the metal frame 202 includes a rectangular-shaped frame, which is larger than the solar panel P to be supported. The metal frame 202 has a lower portion, which fits an annular recess 204 on the top surface 201 of the resin-made pallet 200, and a planar top surface 203. More specifically, the metal frame 202 has a hollow rectangular shape in a cross-sectional surface. The metal frame 202 has long sides 209, which oppose each other in parallel, and short sides 211, which oppose each other in parallel. The metal frame 202 further includes a reinforcing frame 213, which couples the opposed frame portions, in the direction approximately perpendicular to the direction of the fork inserted into the resin-made pallet 200. At each of the four corners of the metal frame 202, an L-shaped groove, which is formed on the inferior surface of the lowest resin-made corner module 100 described later, fits the top surface 203 of the metal frame 202. The inner edge and the outer edge of the L-shaped groove on the lowest resin-made corner module 100 are in abutment with an orthogonal part of the inner surface of the metal frame 202 and an orthogonal part of the outer surface of the metal frame 202, respectively. The lengths of the long side 209 and the short side 211 may be each determined depending on the size of the solar panel P to be stacked. As described above, the width of the top surface 203, which is annular rectangular-shaped, may be determined depending on the size of the L-shaped groove on the lowest resin-made corner module 100 described later. The metal frame 202 has through-holes 210 in a part other than the four corner portions. The through-hole 210 passes through the inferior surface that is in contact with a bottom portion 215 of the annular recess 204. The bottom portion 215 of the annular recess 204 has screw holes (not shown). Aligning the through-hole 210 with the screw hole and screwing a fixation screw (not shown) secures the metal frame 201 to the resin-made pallet 200.

Accordingly, when the solar panels P are stacked on the top surface 201 of the resin-made pallet 200 using the resin-made corner module 100, the lowest module among the resin-made corner modules 100 stacked in a columnar shape at each of the four corners of the solar panel P is stably placed on the planar top surface 203 of the metal frame 202. The inner surface of the metal frame 202 is in contact with the inner edge of the lowest resin-made corner module 100. This restricts outward movement of the lowest resin-made corner module 100 relative to the resin-made pallet 200. The outer surface of the metal frame 202 is in contact with the outer edge of the lowest resin-made corner module. This restricts inward movement of the lowest resin-made corner module 100 relative to the resin-made pallet 200. Accordingly, the lowest resin-made corner module 100 is positioned relative to the resin-made pallet 200 via the metal frame 202.

As illustrated in FIG. 4, the annular recess 204 is disposed on the peripheral edge portion of the top surface 201 of the resin-made pallet 200. The annular recess 204 fits the lower portion of the metal frame 202. The annular recess 204 is formed to ensure the horizontality of the top surface 203 of the metal frame 202 when the lower portion of the metal frame 202 fits the annular recess 204. As described later, because the metal frame 202 has a rectangular cross-section and has the shape of rectangular frame, the annular recess 204 has a rectangular cross-section complementary to the cross-section of the metal frame 202, and has a rectangular-shaped annular shape. The resin-made corner module 100 includes a sandwiching support portion, which sandwiches and supports the solar panel P, a load transmitting portion, which is coupled with the sandwiching support portion and transmits the weight of the solar panel P in the vertical direction, and a positioning portion, which positions the solar panel P in the horizontal direction.

As illustrated in FIG. 5 to FIG. 8, the resin-made corner module 100 is line-symmetric and L-shaped. The sandwiching support portion includes a pair of plate-shaped bodies 16, each of which includes an upper plate-shaped body 12 and a lower plate-shaped body 14, and a vertical wall 18, which couples the upper plate-shaped body 12 with the lower plate-shaped body 14. The upper plate-shaped body 12 and the lower plate-shaped body 14 are coupled with each other in parallel at a distance in the vertical direction. The load transmitting portion has a box structure 22, which is attached to an outer surface 20 of the vertical wall 18. The resin-made corner module 100 is made of resin and integrally molded. As described later in detail, the resin-made corner module 100 is placed at each of the four corners of the solar panel P to sandwich and support the solar panel P. The next resin-made corner module 100 is then stacked on each resin-made corner module 100 to support the next solar panel P. This is repeated to stack the solar panels P in the vertical direction. In view of this, the weight of the solar panel P is transmitted through the resin-made corner modules 100 stacked in a columnar shape at each corner. The weight of all the stacked solar panels P is loaded on the lowest resin-made corner module 100. The resin-made corner module 100 includes a resin material of thermoplastic resin that includes amorphous resin, olefin-based resin such as polyethylene and polypropylene, and a similar material. More specifically, the resin-made corner module 100 includes a resin material of polyolefin (such as polypropylene and high density polyethylene), which is a homopolymer or a copolymer of olefin such as ethylene, propylene, butene, isoprene pentene, and methyl pentene. Because the resin-made corner module 100 has a comparatively complicated structure, it is especially appropriate to be integrally molded by injection molding.

The upper plate-shaped body 12 and the lower plate-shaped body 14, which constitute the pair of the plate-shaped bodies 16, are each L-shaped. The vertical wall 18 is provided to couple an outer edge 31 of the upper plate-shaped body 12 with an outer edge 33 of the lower plate-shaped body 14 such that the upper plate-shaped body 12 and the lower plate-shaped body 14 form an approximately U-shaped cross-sectional surface, as clearly illustrated in FIG. 5. Accordingly, the pair of the plate-shaped bodies 16 forms the sandwiching support portion to sandwich and support the solar panel P. The solar panel P is inserted between the upper plate-shaped body 12 and the lower plate-shaped body 14, from the opening of the U-shaped cross-sectional surface, to be sandwiched and supported. As illustrated in FIG. 5 and FIG. 6, reinforcing ribs 41 and 43 are respectively disposed on the upper plate-shaped body 12 and the lower plate-shaped body 14. Especially when the solar panel P is sandwiched and supported, the weight of the solar panel P is loaded on the lower plate-shaped body 14. Thus the reinforcing ribs 43 support the lower plate-shaped body 14 from below. The top surface of the lower plate-shaped body 14 constitutes a support surface, which is in abutment with and supports the inferior surface of the solar panel P.

As illustrated in FIG. 6, the box structure 22 is disposed on the outer surface 20 of the vertical wall 18. The box structure 22 includes a plurality of ribs 36 inside and has an L-shaped cross-sectional surface. The box structure 22 forms the load transmitting portion, which includes the load transmitting surface formed outward from the outer surface 20 of the vertical wall 18. More specifically, a top surface 37 and an inferior surface 39 of the box structure 22 are in parallel with each other. When the solar panels P are stacked, the top surface 37 forms a load receiving surface 74, which receives a load from the upper resin-made corner module 100, while the inferior surface 39 forms a load releasing surface 72, which releases the load to the lower resin-made corner module 100. The positioning portion has a projecting portion 70, which projects downward, in the lower portion of the resin-made corner module 100. When the upper resin-made corner module 100 is stacked on the lower resin-made corner module 100 such that the load releasing surface 72 of the upper resin-made corner module 100 is placed on the load receiving surface 74 of the lower resin-made corner module 100, the outer surface of the projecting portion 70 of the upper resin-made corner module 100 is brought into contact with the inner surface of the upper portion of the lower resin-made corner module 100 from inside.

More specifically, the projecting portion 70 has a second stepped portion 80, which is formed on the load releasing surface 72. The projecting portion 70 also has a first stepped portion 78, which is formed on the load receiving surface 74 and has the shape complementary to the second stepped portion 80. As illustrated in FIG. 5, the first stepped portion 78 has a lower horizontal surface 82, an upper horizontal surface 84, and a first inclined surface 86. The lower horizontal surface 82 is disposed on the side closer to the sandwiching support portion. The upper horizontal surface 84 is disposed on the side far from the sandwiching support portion. The first inclined surface 86 is interposed between the lower horizontal surface 82 and the upper horizontal surface 84, and faces upward and outward from the outer surface of the vertical wall. On the other hand, as illustrated in FIG. 6, the second stepped portion 80 has a lower horizontal surface 88, an upper horizontal surface 90, and a second inclined surface 92. The lower horizontal surface 88 is disposed on the side closer to the sandwiching support portion. The upper horizontal surface 90 is disposed on the side far from the sandwiching support portion. The second inclined surface 92 is interposed between the lower horizontal surface 88 and the upper horizontal surface 90, and faces upward and outward from the outer surface of the vertical wall. Accordingly, between the stacked resin-made corner modules adjacent to each other in the vertical direction, the lower horizontal surface 82, the first inclined surface 86, and the upper horizontal surface 84 of the first stepped portion 78 of the lower resin-made corner module 100 respectively abut against the lower horizontal surface 88, the second inclined surface 92, and the upper horizontal surface 90 of the second stepped portion 80 of the upper resin-made corner module 100. Thus the whole top surface 37 of the box structure 22 forms the load receiving surface while the whole inferior surface 39 of the box structure 22 forms the load releasing surface.

With the configuration described above, as illustrated in FIG. 8, when the upper module is stacked on the lower module such that the load releasing surface of the upper resin-made corner module 100 is placed on the load receiving surface of the lower resin-made corner module 100, the first inclined surface 86 of the upper resin-made corner module 100 is brought into abutment with the second inclined surface 92 of the lower resin-made corner module 100 from inside. This inhibits outward horizontal movement of the upper resin-made corner module 100 relative to the lower resin-made corner module 100. Additionally, because the resin-made corner module 100 is disposed at each of the four corners of the solar panel P, the slipping out of the upper resin-made corner module 100 inside, namely, inward horizontal movement of the upper resin-made corner module 100 relative to the lower resin-made corner module 100, are restricted via the solar panel P. Especially, the upper plate-shaped body 12 and the lower plate-shaped body 14 are each formed to be L-shaped, as described above. This allows for restriction in two directions perpendicular to each other on the horizontal surface. More specifically, inward movement of the upper resin-made corner module 100 relative to the lower resin-made corner module 100 in two directions perpendicular to each other is restricted. On the other hand, outward movement of the upper resin-made corner module 100 relative to the lower resin-made corner module 100 in two directions perpendicular to each other is restricted. A plurality of ribs 36 is disposed. The ribs 36 are each disposed in parallel with the end surfaces 94 and 95 of the box structure 22 to extend in the vertical direction. Among the resin-made corner modules 100, the lowest resin-made corner module 100 placed on the top surface of the resin-made pallet 200 has the structure similar to other resin-made corner modules 100 in the upper side portion, but has a different structure in the lower side portion because it is placed on the metal frame 202. Namely, in the lower side portion, an L-shaped groove (not shown), which extends from the end surface 94 to the end surface 95, is formed, and the inner edge (not shown) and the outer edge (not shown) of the L-shaped groove are disposed. The lowest resin-made corner module 100 is placed on the metal frame 202 such that the bottom face, the inner edge, and the outer edge of the L-shaped groove respectively abut against the top surface, the inner surface, and the outer surface of the corner portion of the metal frame 202. This causes the lowest resin-made corner module 100 to be positioned.

The box structure 22 itself constitutes the load transmitting portion and requires strength. Therefore, the areas of the top surface 37 and the inferior surface 39, the thickness and the number of the rib 36 in the box structure 22, or the like may be determined, in view of the above aspect.

A description will be given on the vibration suppressing body 300. As illustrated in FIG. 9 and FIG. 10, the vibration suppressing body 300 has a fixed shape and is made of resin. The vibration suppressing body 300 is shaped to be approximately a rectangular parallelepiped shape and elongated so as to be longer than the short side of the solar panel P. The vibration suppressing body 300 has abutting surfaces 304, which are allowed to abut against a planar portion 302 of the solar panel P and each disposed on the top surface and the inferior surface. As illustrated in FIG. 8, the vibration suppressing body 300 has the thickness H that is determined to be equal to or less than the distance D between the inferior surface of the upper solar panel P and the top surface of the lower solar panel P, as for the solar panels P adjacent to each other in the vertical direction. Accordingly, as described later, the vibration suppressing body 300 is disposed between the solar panels P, which are each supported by the support surface from below and are adjacent to each other in the vertical direction. Any kind of resin may be used for the vibration suppressing body 300 insofar as, when the solar panel P is vibrated, the abutting surface 304 serves as the portion that abuts against the planar portion 302 of the solar panel P and restricts amplitude of the solar panel P within a predetermined range, and has a cushioning property so as not to break the solar panel P when the solar panel P collides with the abutting surface 304 in the case where plural solar panels P, which are stacked on the top surface of a pallet, are conveyed by the pallet or are transported by a motor truck, as described later. The vibration suppressing body 300 has the thickness H that stands for the thickness in a state where the vibration suppressing body 300 is disposed between the solar panels P, which are stacked in the vertical direction. For example, in the case where a vibration suppressing body 300 is made of soft resin, this vibration suppressing body 300 may be used as the above-described vibration suppressing body 300 insofar as the vibration suppressing body 300 is disposed between the solar panels P and compressed by the weight of the solar panel P and has the thickness equal to or less than the distance D, even if the thickness of the vibration suppressing body 300 is thicker than the distance D in an unloaded state where the vibration suppressing body 300 is not yet disposed between the solar panels P.

The vibration suppressing body 300 is disposed in the center of the solar panel P supported by the resin-made corner module 100 at each corner portion from below. The vibration suppressing body 300 has the width W that is determined depending on the proportion of the supported area of the solar panel P, which is supported by a set of the resin-made corner modules 100, to the area of the planar portion 302 of the solar panel P, the weight of the solar panel P, and the configuration where the solar panel P is supported by the resin-made corner modules 100. More specifically, in the case where the solar panel P is heavy and large, and the proportion of the supported area of the solar panel P, which is supported by the set of the resin-made corner modules 100, to the area of the planar portion 302 of the solar panel P is small because the support surface of the resin-made corner module 100 is small, the width W of the vibration suppressing body 300 is required to be large.

As illustrated in FIG. 9, a recess 308, which wholly extends across the width direction of the vibration suppressing body 300, is disposed on the upper side of each end portion 306 of the vibration suppressing body 300. On the other hand, as illustrated in FIG. 10, a protrusion 310, which wholly extends across the width direction of the vibration suppressing body 300 and has a shape complementary to the recess 308, is disposed on the lower side of each end portion 306. At each end portion, the protrusion 310 of the upper vibration suppressing body 300 is inserted into the recess 308 of the lower vibration suppressing body 300. This restricts movement of the upper vibration suppressing body 300 in the longitudinal direction relative to the lower vibration suppressing body 300. The configuration where the protrusion 310 is disposed on the upper side and the recess 308 is disposed on the lower side may be employed. Alternatively, the configuration where the protrusion 310 is disposed on the upper side and the recess 308 is disposed on the lower side at one end while the recess 308 is disposed on the upper side and the protrusion 310 is disposed on the lower side at the other end may be employed. With this configuration, movement of the vibration suppressing bodies 300 in the longitudinal direction, which are adjacent to each other in the vertical direction, is restricted when the vibration suppressing bodies 300 are stacked in the vertical direction. This allows for maintenance of the stable stacked state.

A recess 313, which extends in the thickness direction, is disposed at the predetermined position in the longitudinal direction on one of side surface portions 312 of the vibration suppressing body 300 in order to avoid a power distribution box 309 and/or a cord 311, which are attached to the stacked solar panels P. As illustrated in FIG. 9 and FIG. 10, a recess 315, which faces outward in the longitudinal direction, is disposed at each end portion 306 of the vibration suppressing body 300 so as to extend in the thickness direction of the vibration suppressing body 300. As described later, when the vibration suppressing bodies 300 are stacked in the vertical direction, the recesses 308 are aligned in the vertical direction at each end portion 306 to form a groove-shape that extends in the vertical direction. When the vibration suppressing bodies 300 are stacked in the vertical direction, the stretching of the band B in a C shape in the recesses 308 of the stacked vibration suppressing bodies 300 allows for restriction of relative movement of the upper vibration suppressing body 300 in the widthwise direction relative to the lower vibration suppressing body 300. In this case, each end of the band B may be fixed to the corresponding edge of the long side of the resin-made pallet 200. Alternatively, the stacked solar panels may be fixed with a band B that has a loop shape such that the resin-made pallet 200 is also surrounded together.

As illustrated in FIG. 11, it is preferred that the vibration suppressing body 300 be solid and made of foamed resin, which is integrally molded, with a plurality of through-holes 314, each of which extends in the thicknesswise direction. The size and the number of the through-holes 314 may be determined from the aspect of required relief. The expansion ratio may be determined such that the vibration suppressing body 300 has a cushioning property so as not to break the solar panel P when the vibration suppressing body 300 collides with the solar panel P. As a modification, the vibration suppressing body 300 may be configured as follows. The vibration suppressing body 300 is configured with a pair of thermoplastic resin plates. Bonding both peripheral edge portions of the pair of thermoplastic resin plates together forms a side peripheral surface and a hermetic hollow portion inside. The pair of thermoplastic resin plates each has a plurality of recesses, which is tapered inward while projecting at the inner surface side, on an outer surface. Each of the plurality of recesses has a butt planar portion in the thinnest end portion. Butt welding of the butt planar portions of respective recesses of one of the pair of resin-made plates and those of corresponding recesses of the other of the pair of resin-made plates back-to-back to each other forms an annular rib, which extends between the pair of resin-made plates. In this case, the number or the size of the annular rib may be determined such that the vibration suppressing body 300 has a cushioning property so as not to break the solar panel P when the vibration suppressing body 300 collides with the solar panel P while the vibration suppressing body 300 ensures the required compressive strength in the thickness direction.

In any case, it is preferred that the vibration suppressing body 300 be formed with a pair of split mold blocks. More specifically, in the case where the vibration suppressing body 300 is solid and made of foamed resin, the protrusion, which is required to form the through-hole 314, is disposed in a cavity, foamed beads are filled between clamped split mold blocks, and foam is grown by supplying water vapor to fuse the foamed beads to one another. On the other hand, in the case where the annular rib is provided in the hollow form, the protrusion, which is required to form the annular rib, is provided in the cavity, a cylinder-shaped parison is hung down between the pair of split mold blocks, the split mold blocks are clamped, and blow pressure is applied to form the annular rib.

As illustrated in FIG. 12, the vibration suppressing body 300 is disposed in parallel with the short side direction at the center position of the long side of the solar panel P such that the recess 308 or the protrusion 310 of each end portion 306 projects outward from the edge corresponding to the long side of the solar panel P. This allows the vibration suppressing bodies 300 to be stacked in the vertical direction using both end portions 306, which project outward from the solar panel P, independently from stacking of the solar panels P. The vibration suppressing bodies 300 are allowed to be stacked so as not to contact the solar panel P according to circumstances. This allows amplitude of the solar panel to be effectively restricted in the center of the solar panel P, where the peak occurs and generates the maximum amplitude when vibration occurs due to conveyance or transport, because the vibration suppressing bodies 300 are each disposed above and below the solar panel P. As illustrated in FIG. 13, the vibration suppressing bodies 300 are each disposed on the top surface and the inferior surface of the solar panel P such that each of the abutment surfaces 304 faces the corresponding planar portion 302 of the solar panel P, so as to restrict the amplitude of the vibration of the solar panel P in the vertical direction, which is caused by conveyance or transport of the plurality of stacked solar panels P, within the predetermined range. The acceptable amplitude is a range where the vibration does not cause a breakage such as cracking of the solar panel P, and may be appropriately determined according to the type of the solar panel P.

It is preferred that a predetermined clearance C (see FIG. 8) be disposed between the inferior surface of the solar panel P, which is supported by the resin-made corner module 100 at each corner portion from below, and the abutment surface 304 of the vibration suppressing body 300, and the predetermined clearance C be equal to or less than 5 mm. If the predetermined clearance C is equal to or more than 5 mm, the vibration of the solar panel during conveyance or transport causes a higher risk of breakage of the solar panel. Especially, it is preferred that the predetermined clearance C be 0 mm, namely, the abutment surface 304 of the upper side of the vibration suppressing body 300 be in contact with the inferior surface of the solar panel P. On the other hand, the abutment surface 304 of the vibration suppressing body 300, which faces the top surface of the solar panel P supported by the resin-made corner module 100 at each corner portion from below, is disposed to be flush with the support surface. Accordingly, the solar panel is supported not only by the corresponding module at each of the four corners, but also supported by the vibration suppressing body 300 in the center from below. This restricts deflection due to it's own weight of the solar panel P in a static state.

As described above, the vibration suppressing bodies 300 are allowed to be stacked independently from the solar panels, which are disposed between the vibration suppressing bodies 300. Accordingly, it is not necessary that the abutment surface 304 of the vibration suppressing body 300 that faces the top surface of the solar panel P is disposed to be flush with the support surface, and a predetermined clearance may be provided similarly to the vibration suppressing body 300 that faces the inferior surface of the solar panel P. The lowest vibration suppressing body 300 needs to be fixed on the top surface 201 of the resin-made pallet 200. In view of this, a recess (not shown), which faces downward, is provided at the position of the lowest vibration suppressing body 300 corresponding to each of the opposed long sides of the metal frame 202, and at the position of the lowest vibration suppressing body 300 corresponding to the reinforcing frame 213 between the opposed long sides, respectively, so as to fit the recesses to the metal frame 202, thus fixing them.

An operation of the rectangular thin panel conveyance unit 10 thus configured will be described below by describing a method of stacking the solar panels P in the vertical direction using the resin-made corner modules 100. A description will be given on an example in the case where the solar panels P are stacked in the vertical direction on the top surface 201 of the resin-made pallet 200 in order to stack a plurality of solar panels P in the vertical direction, convey the solar panels P by a forklift truck, and transport the solar panels P by a motor-truck. First, the resin-made corner modules 100 are each placed concurrently at the corresponding corner of the four corners of each of a plurality of solar panels P to be stacked. More specifically, the solar panel P is inserted between the lower plate-shaped plate 14 and the upper plate-shaped plate 12 from the opening of the U-shaped cross-sectional surface of the resin-made corner module 100 to be sandwiched. Accordingly, the resin-made corner module 100 is fixed to the solar panel P.

This process is concurrently performed for the respective solar panels P so as to prepare the solar panels P where the resin-made corner modules 100 are placed at the four corners. This eliminates a process of placing the resin-made corner modules 100 at the four corners of the solar panel P on the top surface of the resin-made pallet 200. Accordingly, the solar panels P can be stacked efficiently.

Next, the resin-made corner modules 100 are stacked in a columnar shape at each corner of the plurality of solar panels P, which have the resin-made corner modules 100 placed at the four corners. At this time, the plurality of solar panels P is sequentially stacked with the vibration suppressing bodies 300, which are also stacked. More specifically, first, the metal frame 202 is fitted to the annular recess 204 on the top surface 201 of the resin-made pallet 200, and the through-hole 210 of the metal frame 202 is aligned with the screw hole on the top surface 201 of the resin-made pallet 200. Then the metal frame 202 is fixed to the resin-made pallet 200 with the fixation screw. Consequently, the annular top surface 203 of the metal frame 202 projects from the annular recess 204 in a state where the annular top surface 203 keeps a predetermined horizontality. Then each of the four corners of the metal frame 202 is ready to place the lowest resin-made corner module 100.

Next, the lowest resin-made corner module 100 is placed at each of the four corners of the metal frame 202. At this time, the lowest vibration suppressing body 300 is disposed in parallel with the short side such that the recess, which faces downward, fits in the center of the long side of the metal frame 202. More specifically, when the lower plate-shaped body 14 of the lowest resin-made corner module 100 is placed on the top surface 203 of the metal frame 202 at each of the four corners, the parts of the inner side surface of the metal frame 202, which are orthogonal to each other, are in contact with the inner edge of the lowest resin-made corner module 100. This restricts outward movement of the lowest resin-made corner module 100 relative to the resin-made pallet 200. At the same time, the parts of the outer side surface of the metal frame 202, which are orthogonal to each other, are in contact with the outer edge of the lowest resin-made corner module 100. This restricts inward movement of the lowest resin-made corner module 100 relative to the resin-made pallet 200. Accordingly, the lowest resin-made corner module 100 is positioned relative to the resin-made pallet 200 via the metal frame 202.

The lowest vibration suppressing body 300 fits the metal frame 202 via the recess, which wholly extends in the width direction of the vibration suppressing body 300. This restricts movement of the lowest vibration suppressing body 300 in the short side direction of the solar panel P, namely, in the longitudinal direction of the vibration suppressing body 300. Accordingly, the lowest vibration suppressing body 300 is fixed to the resin-made pallet 200 through the metal frame 202. Next, a plurality of solar panels P with the resin-made corner modules 100 placed at the four corners is sequentially stacked such that the resin-made corner modules 100 are stacked in a columnar shape at each corner. More specifically, the resin-made corner modules 100 are stacked at each corner as follows. The inferior surface 39 of the box structure 22 of the next resin-made corner module 100 is placed on the top surface 37 of the box structure 22 of the resin-made corner module 100 at the top, which is placed on the top surface of the resin-made pallet 200, such that the first stepped portion of the next resin-made corner module 100 is in contact with the second stepped portion of the resin-made corner module 100 at the top from inside. Accordingly, the lower horizontal surface, the first inclined surface, and the upper horizontal surface of the next resin-made corner module 100 respectively abut against the lower horizontal surface, the second inclined surface, and the upper horizontal surface of the resin-made corner module 100 at the top. The resin-made corner modules 100 are stacked at each corner portion such that the load is transmitted from the inferior surface 39 of the box structure 22 of the next resin-made corner module 100 to the top surface 37 of the box structure 22 of the resin-made corner module 100 at the top.

Next, the solar panel P is placed on the support surface of the resin-made corner module 100, which is newly stacked at each corner. Then the vibration suppressing body 300 is newly stacked such that the protrusion 310 of the new vibration suppressing body 300 is inserted into the recess 308 of the vibration suppressing body 300, which has been already disposed, at each end portion 306. This restricts movement of the new upper vibration suppressing body 300, in the short side direction of the solar panel P, namely, in the longitudinal direction of the vibration suppressing body 300, relative to the lower vibration suppressing body 300, which is adjacent in the vertical direction. Accordingly, the vibration suppressing bodies 300 can be stably stacked.

As described above, the resin-made corner modules 100 are stacked at each of the four corners, the solar panels P are placed on the support surface of the stacked resin-made corner modules 100, and the vibration suppressing body 300 is stacked at the center of the long side of the placed solar panels P such that the vibration suppressing body 300 is stacked across the solar panels P and in parallel with the short side of the solar panels P. Repeating this process allows the plurality of resin-made corner modules 100 to be stacked in a columnar shape at each of the four corners of the plurality of solar panels P. This allows for stacking of the plurality of solar panels P in the vertical direction such that each of the plurality of solar panels P is sandwiched between the vibration suppressing bodies 300. After the last solar panel P is stacked, a belt B is placed in the recesses 308 of the stacked vibration suppressing bodies 300 in a C shape and, for example, each end of the belt B is fixed to the corresponding edge of the resin-made pallet 200. This allows the solar panels P to be fixed to the resin-made pallet 200, and also restricts relative movement of the upper vibration suppressing body 300 in the longer side direction of the solar panel P relative to the lower vibration suppressing body 300, as for the vibration suppressing bodies 300, which are adjacent to each other in the vertical direction. According to circumstances, at each of the four corners, a lid plate may be placed on the top surface of the resin-made corner module 100 at the top, and the conveyance unit may be further stacked on these resin-made corner modules 100.

Moreover, the plurality of solar panels P with the resin-made pallet 200 at the bottom can be conveyed in a state where the plurality of solar panels P is stably stacked in the vertical direction without risk of collapse of the resin-made corner modules stacked in a columnar shape during conveyance by a forklift truck or transport by a motortruck. The stacked solar panels P with the resin-made pallet 200 can be also stored in a predetermined place. More specifically, when conveyance or transport on an uneven road surface by a forklift truck or a motortruck causes vibration on each of the solar panels P via the resin-made corner module, damage or breakage of the solar panel P during conveyance can be prevented as follows. Because each solar panel P is interposed between the vibration suppressing bodies 300 in the center of the long side where the maximum amplitude occurs, the contact surface 304 of the vibration suppressing body 300 is in contact with the planar portion 302 of the solar panel P to restrict the amplitude of the solar panel P within a predetermined range. This prevents breakage of the solar panel P during vibration, even if the solar panel P is in contact with the vibration suppressing body 300.

The conveyance unit for the solar panel P thus configured allows for conveyance of the plurality of stacked solar panels P with the conveyance pallet, by a forklift truck, for example, in the following manner. The set of the resin-made corner modules 100 at the lowest position among the sets of four resin-made corner modules 100 is placed, for example, on the top surface of the conveyance pallet. Each resin-made corner module 100 supports the corner portion of the solar panel P to be conveyed from below. The resin-made corner modules 100 are stacked in a columnar shape in the vertical direction at each corner portion. Accordingly, the plurality of solar panels P is stacked in the vertical direction such that the weight of the plurality of solar panels P is supported by the plurality of resin-made corner modules 100 in a columnar shape. Conveyance where, for example, a motortruck transports the plurality of stacked solar panels P, or a forklift truck moves on an uneven road surface causes vibration on the plurality of solar panels P via the resin-made corner modules 100. The mode of the vibration has a bottom at the support portion of the solar panel P, which is supported by the resin-made corner module 100, and a peak at approximately in the center of the solar panel P. The vibration suppressing body in a fixed shape is disposed on each of the top surface and the inferior surface of each solar panel P. The vibration suppressing body has the contact portion for the planar portion of the solar panel P. This contact portion is disposed so as to face the planar portion of the solar panel P in order to restrict the amplitude of the vibration in the vertical direction within the predetermined range. Accordingly, when the vibration occurs, the planar portion of the solar panel P is brought into contact with the contact portion, and the amplitude approximately in the center of the solar panel P, which is the maximum amplitude, is restricted. This surely prevents damage or breakage of the solar panel P during conveyance.

The embodiment of the present invention is described in detail above. A person skilled in the art may make various modifications and changes insofar as they are not out of the scope of the present invention. For example, in this embodiment, a description has been given on the case where the vibration suppressing body 300 that is longer than the short side of the rectangular solar panel P is used so as to project the vibration suppressing body 300 outward from the respective edges of long sides of the panel. This projecting end portion 306 is used to stack the vibration suppressing bodies 300 in the vertical direction. However, the embodiment is not limited to the case described above. A vibration suppressing body 300 that is shorter than the short side of the rectangular solar panel P may be used to be placed and fixed on the top surface of the rectangular solar panel P in a state where the vibration suppressing bodies 300, which are adjacent to one another in the vertical direction, are not coupled.

In this embodiment, the metal frame is used to stack the plurality of solar panels P on the top surface of the pallet in the vertical direction. However, the embodiment is not limited to the case described above. The metal frame may be omitted and the plurality of solar panels P may be stacked directly on the top surface of a pallet insofar as the number of the solar panels P to be stacked is small and the flatness of the top surface of the pallet is ensured so as not to be an obstacle of stacking and conveyance.

DESCRIPTION OF REFERENCE SIGNS

Figure 1:
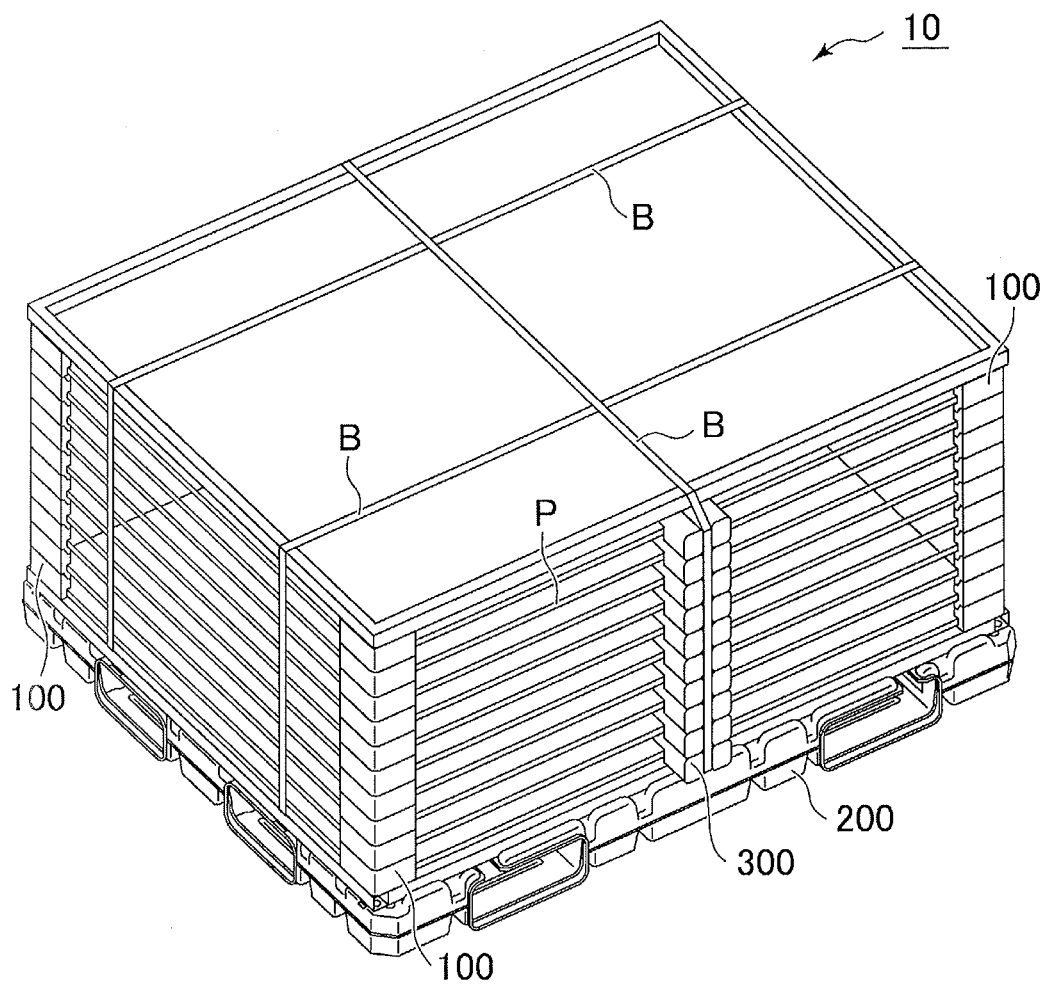
FIG. 1 is an entire perspective view illustrating a conveyance unit for a solar panel P according to an embodiment of the present invention.
Figure 2:
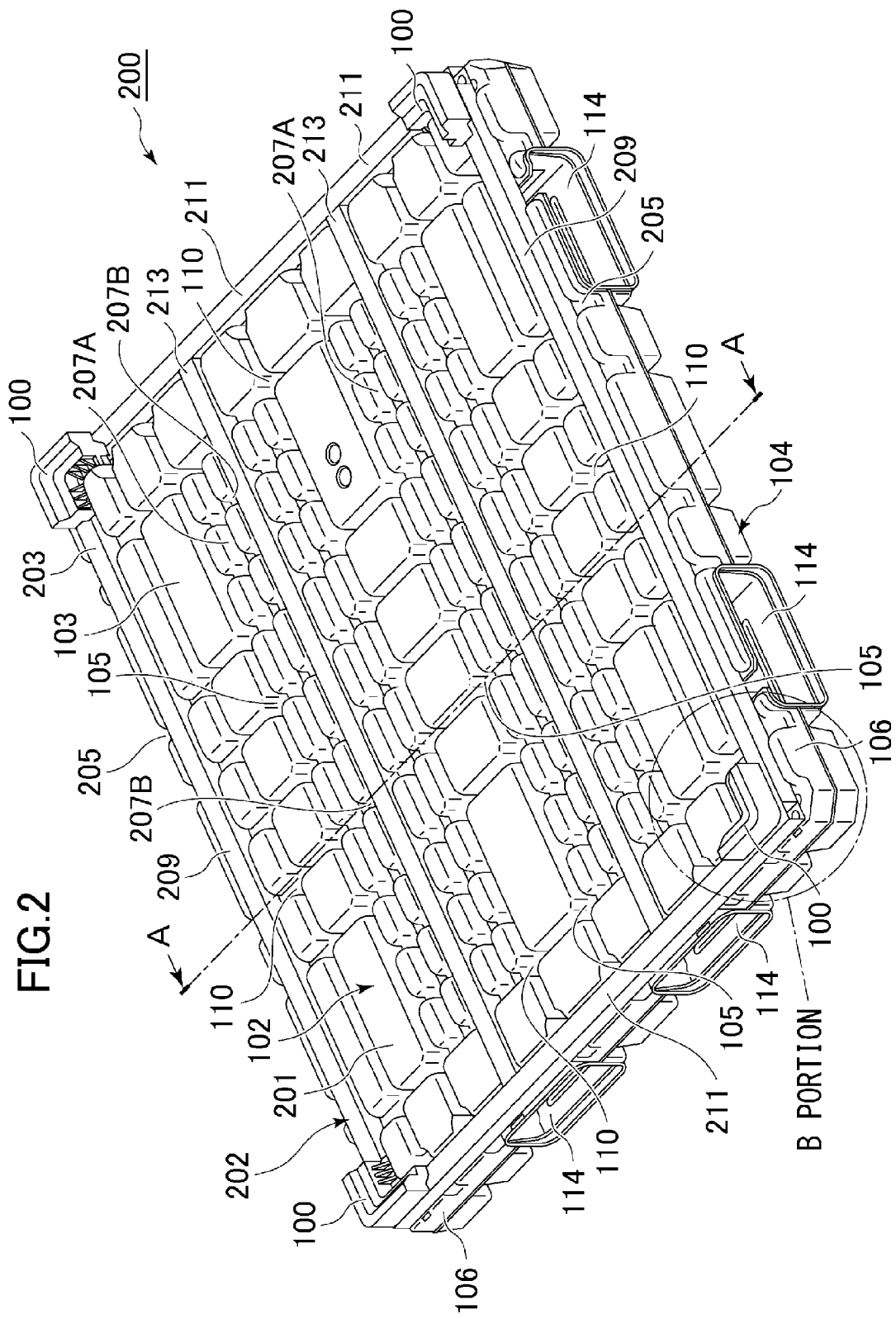
FIG. 2 is a plan view of a top surface of a resin-made pallet 200 and a metal frame of the conveyance unit for the solar panel P according to the embodiment of the present invention.
Figure 3:
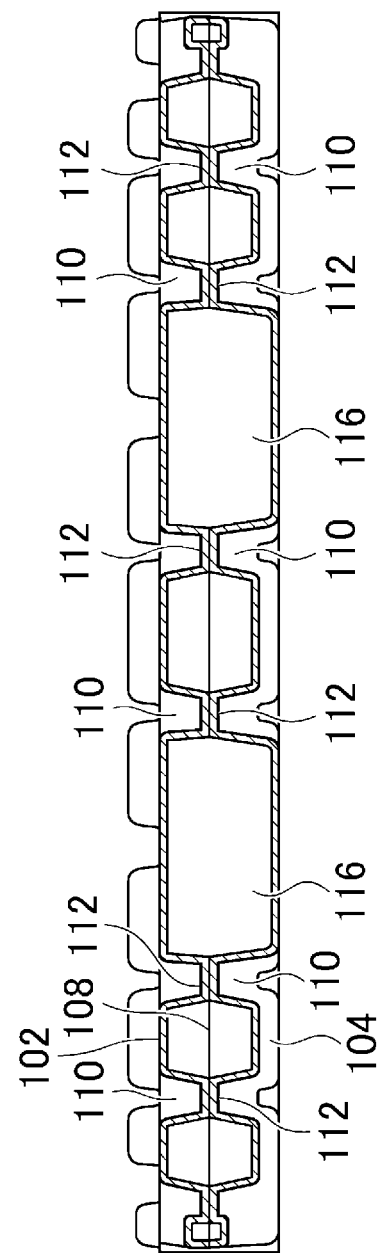
FIG. 3 is a cross-sectional view along the line A-A in FIG. 2.
Figure 4:
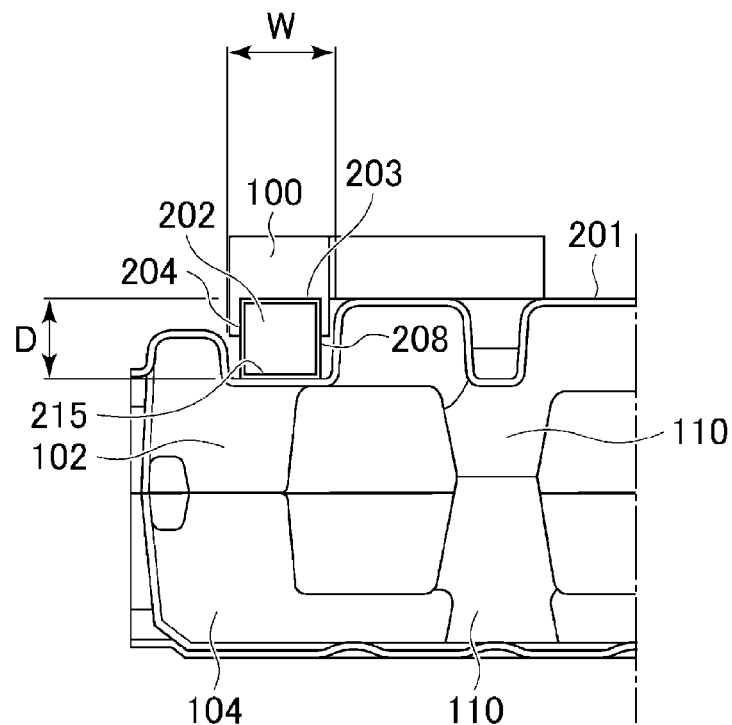
FIG. 4 is a detailed view of a part B in FIG. 2.
Figure 5:
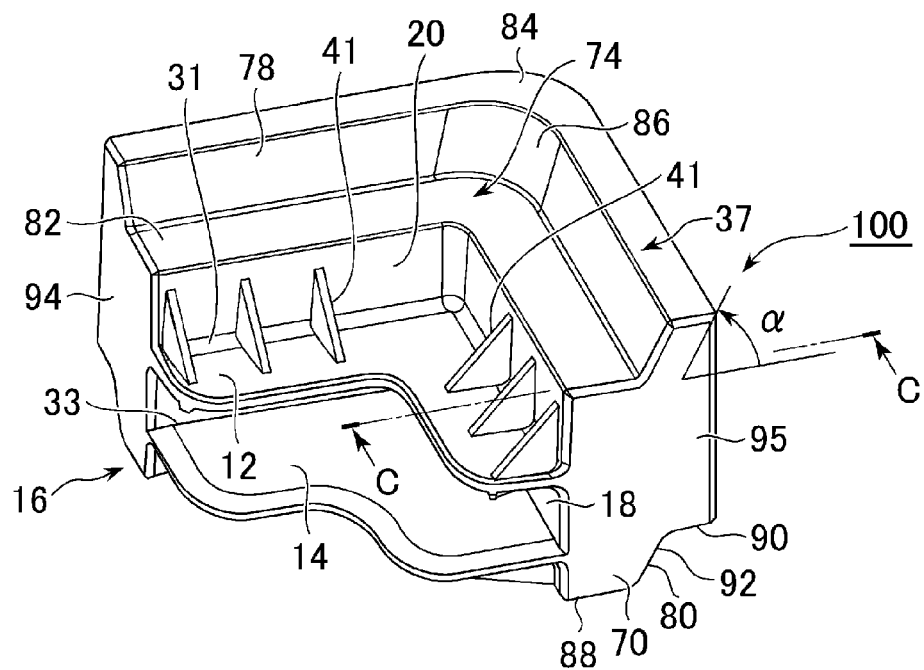
FIG. 5 is an entire perspective view, which is viewed obliquely from above, illustrating a resin-made corner module 100 of the conveyance unit for the solar panel P according to the embodiment of the present invention.
Figure 6:
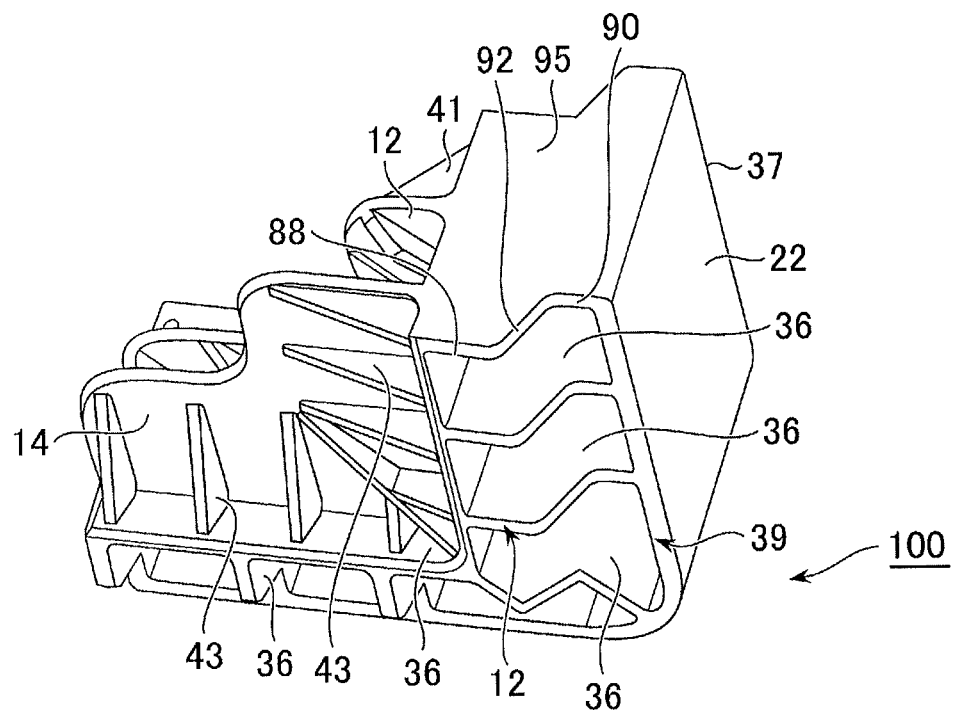
FIG. 6 is an entire perspective view, which is viewed obliquely from below, illustrating the resin-made corner module 100 of the conveyance unit for the solar panel P according to the embodiment of the present invention.
Figure 7:
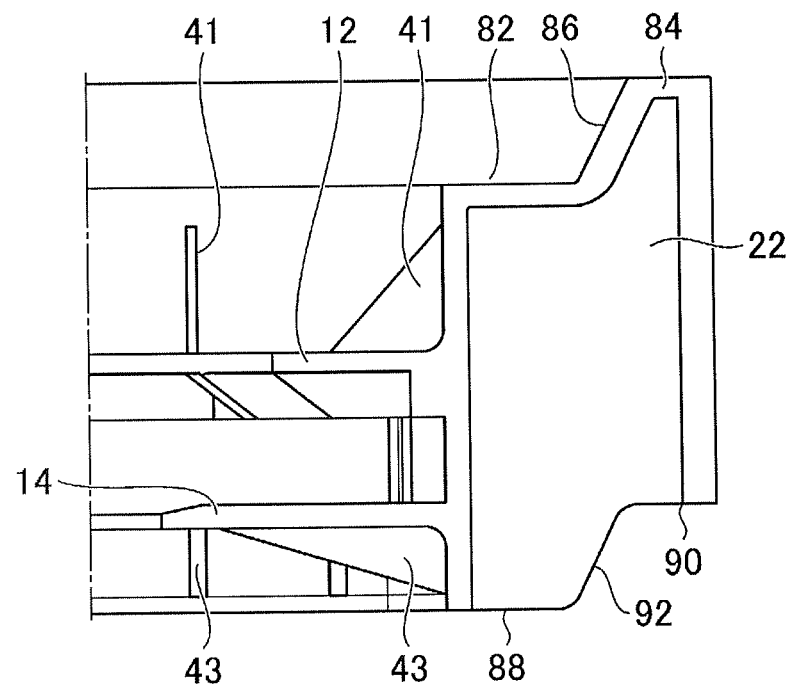
FIG. 7 is a cross-sectional view along the line C-C in FIG. 5.
Figure 8:
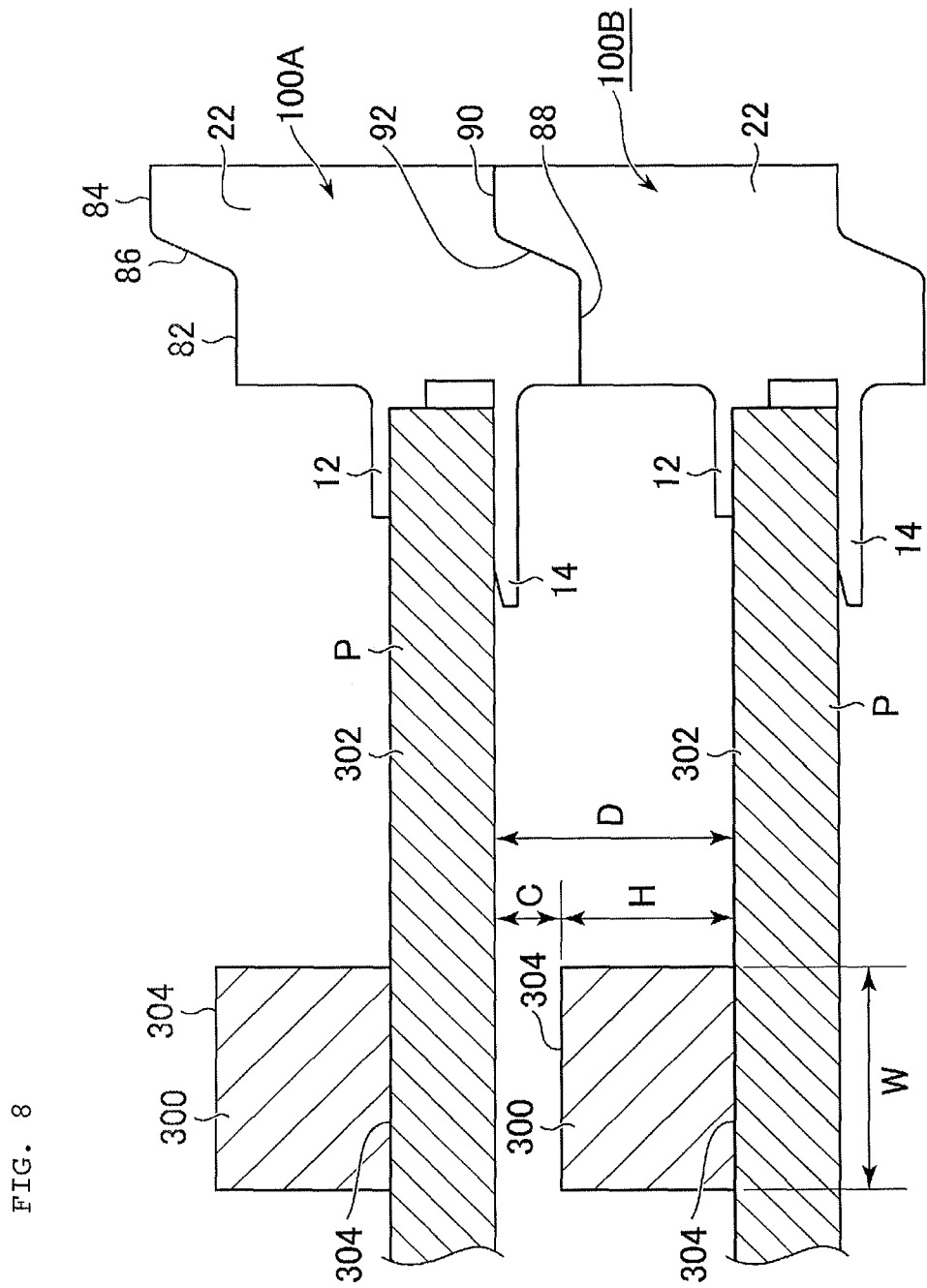
FIG. 8 is a partial schematic diagram illustrating the stacked resin-made corner modules 100 of the conveyance unit for the solar panel P according to the embodiment of the present invention.
Figure 9:
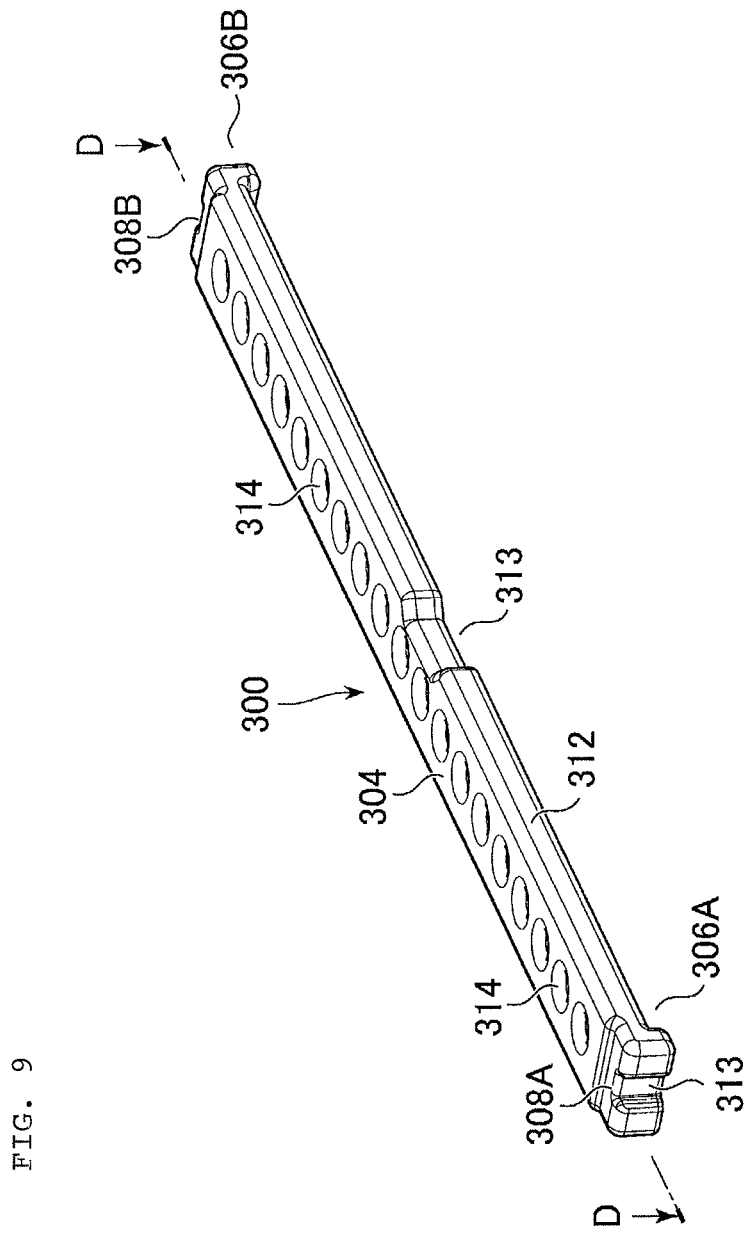
FIG. 9 is an entire perspective view, which is viewed obliquely from above, illustrating a vibration suppressing body 300 of the conveyance unit for the solar panel P according to the embodiment of the present invention.
Figure 10:
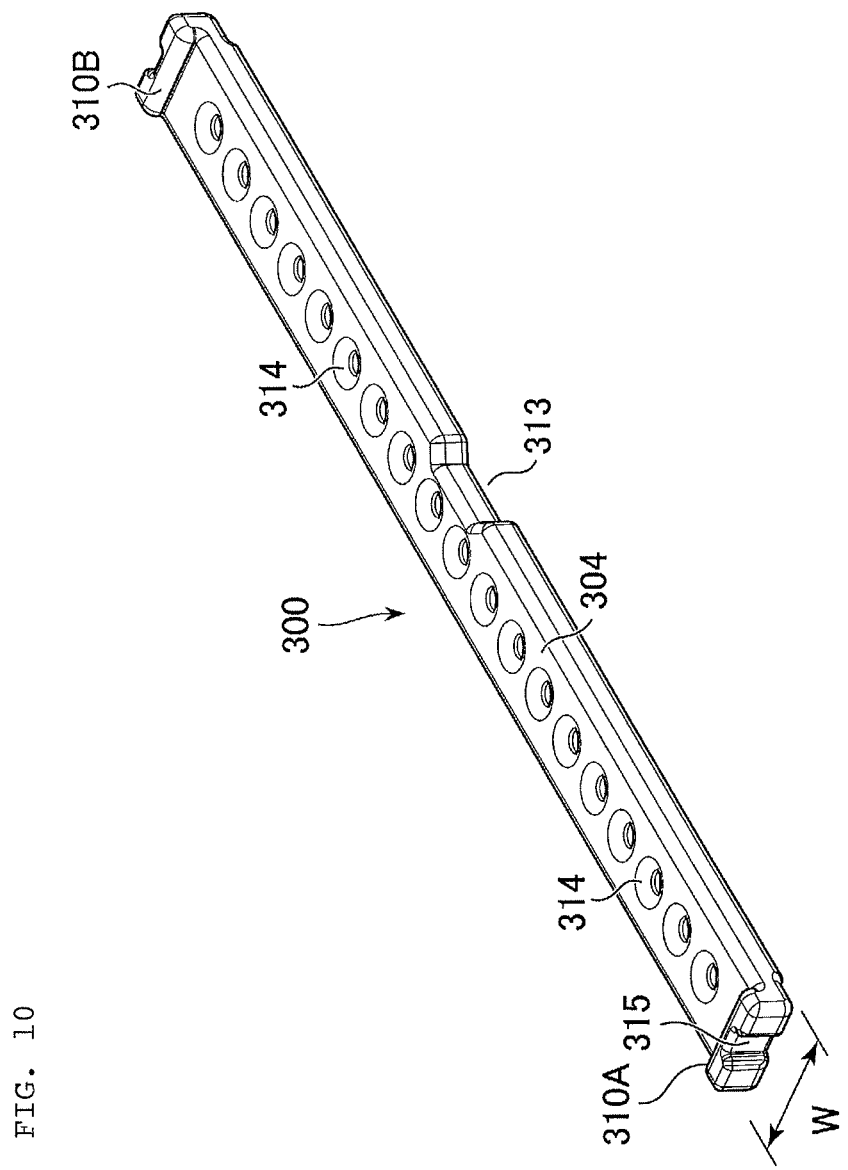
FIG. 10 is an entire perspective view, which is viewed obliquely from below, illustrating the vibration suppressing body 300 of the conveyance unit for the solar panel P according to the embodiment of the present invention.
Figure 11:
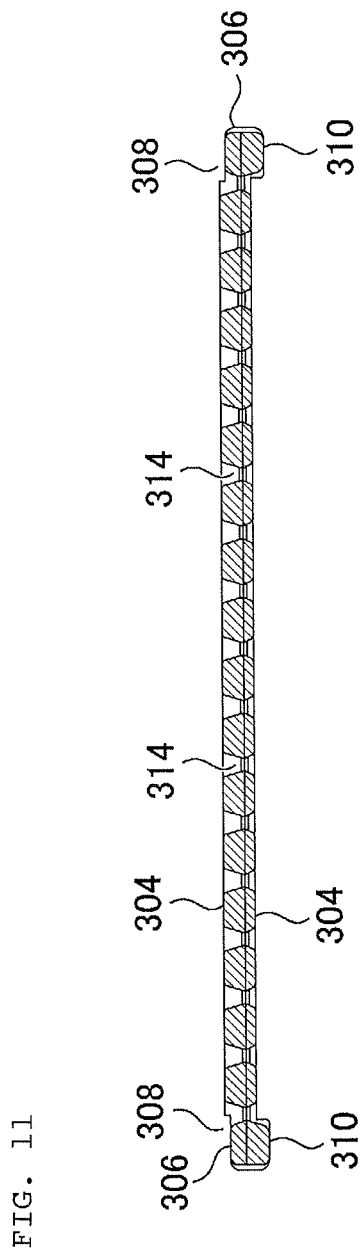
FIG. 11 is a cross-sectional view along the line D-D in FIG. 9.
Figure 12:
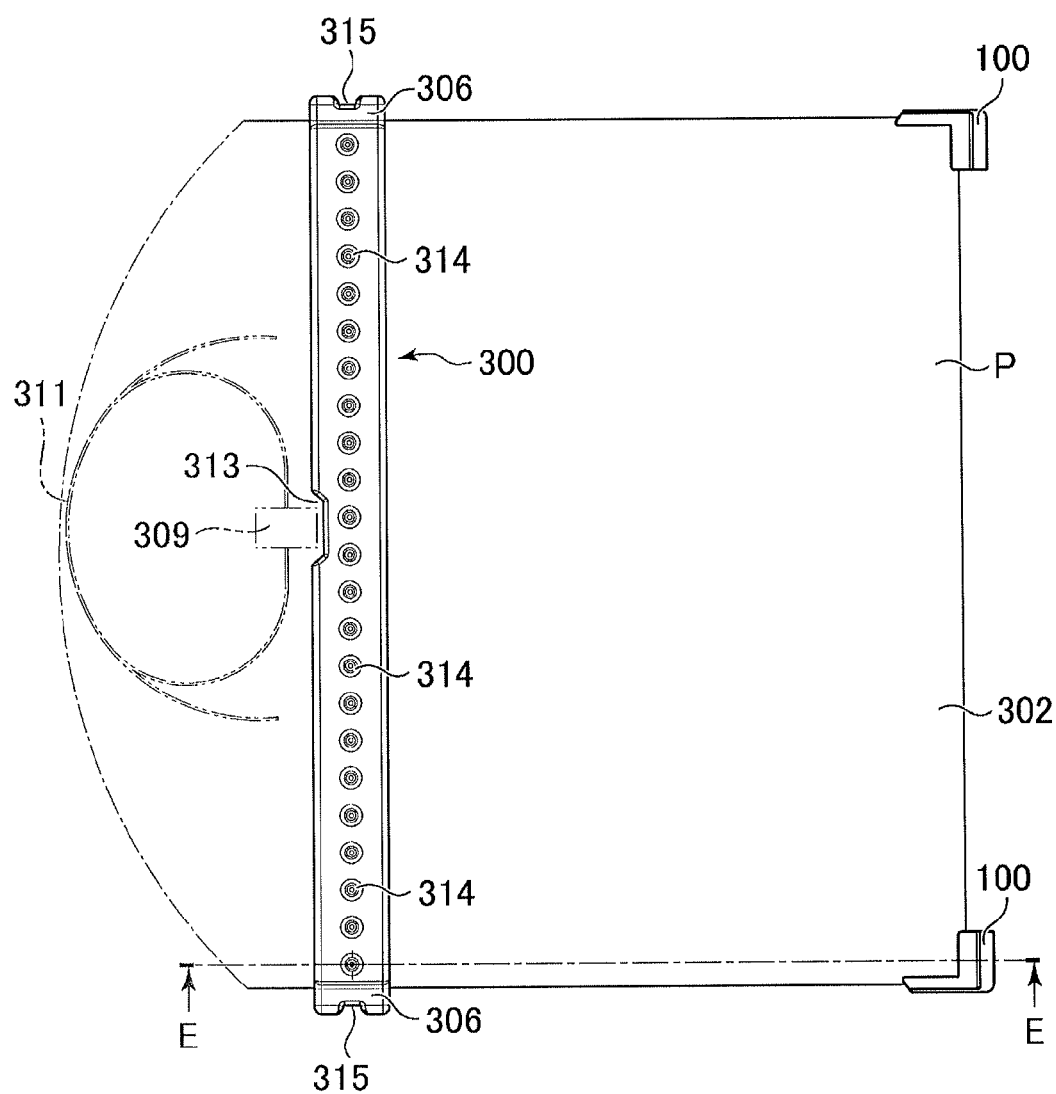
FIG. 12 is a partial plan view illustrating the stacked resin-made corner modules 100 of the conveyance unit for the solar panel P according to the embodiment of the present invention.
Figure 13:
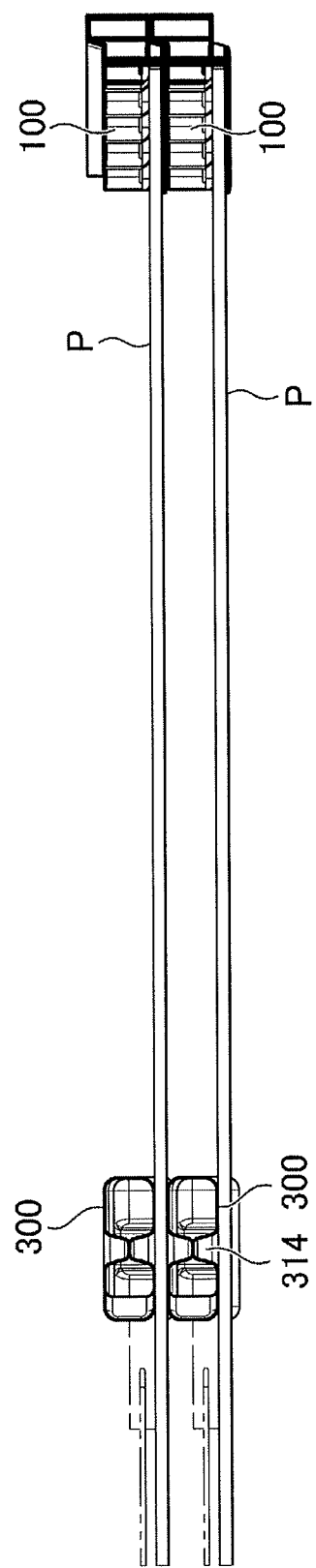
FIG. 13 is a cross-sectional view along the line E-E in FIG. 12.

P Solar panel
10 Rectangular thin panel conveyance unit
12 Upper plate-shaped body
14 Lower plate-shaped body
16 Plate-shaped body
18 Vertical wall
20 Outer surface
22 Box structure
26 Top surface
36 Rib
37 Top surface
39 Inferior surface
41 Reinforcing rib
43 Reinforcing rib
45 Inner edge
49 Inferior edge
70 Projecting portion
78 First stepped portion
80 Second stepped portion
82 Lower horizontal surface
84 Upper horizontal surface
86 First inclined surface
86 Inner edge
88 Lower horizontal surface
90 Upper horizontal surface
92 Second inclined surface
94 End surface
95 End surface
96 Load receiving horizontal surface
97 Inner edge
98 Load releasing horizontal surface
100 Resin-made corner module
102 Resin-made first plate
103 Outer surface
104 Resin-made second plate
105 Opening
106 Side peripheral surface
107 Peripheral side surface
108 Hollow portion
109 Inner circumferential surface
110 Recess
111 Peripheral edge portion
112 Butt planar portion
114 Fork insertion opening
116 Fork insertion space
200 Resin-made pallet
201 Top surface
202 Metal frame
203 Bottom face
204 Annular recess
205 Reinforcing groove
207 Groove
209 Long side
210 Through-hole
211 Short side
213 Reinforcing frame
215 Bottom portion
300 Vibration suppressing body
302 Planar portion
304 Contact surface
306 End portion
308 Recess
309 Power distribution box
310 Protrusion
311 Cord

The invention claimed is:

1. A rectangular thin panel conveyance unit, comprising:
a plurality of sets of four corner modules, the corner module having a support surface, the support surface supporting each corner portion of a rectangular thin panel from below; and
a vibration suppressing body for the rectangular thin panel in a fixed shape, wherein
the vibration suppressing body has a thickness that is equal to or less than a distance between an inferior surface of an upper rectangular thin panel and a top surface of a lower rectangular thin panel when the corner modules are stacked in a columnar shape in a vertical direction at each corner portion such that the plurality of rectangular thin panels is stacked in the vertical direction, the upper rectangular thin panel and the lower rectangular thin panel being adjacent to each other in the vertical direction,
the vibration suppressing body is disposed on each of the top surface and the inferior surface of the rectangular thin panel such that the vibration suppressing body faces a planar portion of each of the rectangular thin panels to restrict an amplitude of a vibration of the rectangular thin panel in the vertical direction within a predetermined range, the vibration being caused by conveyance of the plurality of stacked rectangular thin panels, and
the vibration suppressing body includes a contact portion for the planar portion of the rectangular thin panel,
wherein:
the vibration suppressing body is made of resin in an elongated shape, the vibration suppressing body being longer than a short side of the rectangular thin panel,
the vibration suppressing body has a concave portion on an upper side or a lower side of each end portion of the vibration suppressing body, a recess extending throughout the width of the vibration suppressing body,
the vibration suppressing body has convex portion on the lower side or the upper side of each end portion of the vibration suppressing body, the convex portion extending throughout the width of the vibration suppressing body, the convex portion having a shape complementary to the concave portion, and
movement of an upper vibration suppressing body relative to a lower vibration suppressing body in a longitudinal direction is restricted by fitting the concave portion or the convex portion of the upper vibration suppressing body the convex portion or the concave portion of the lower vibration suppressing body.

2. The rectangular thin panel conveyance unit according to claim 1, further comprising
a conveyance pallet with a top surface on which a set of the corner modules at the lowest position rest.

3. The rectangular thin panel conveyance unit according to claim 1, wherein
the vibration suppressing body is disposed in parallel with a short side direction at a center position of a long side of the rectangular thin panel such that the concave portion or the convex portion at each end portion of the vibration suppressing body projects outward from an edge of the corresponding long side of the rectangular thin panel.

4. The rectangular thin panel conveyance unit according to claim 1, wherein
the vibration suppressing bodies are stacked such that a predetermined clearance is provided between the planar portion of the rectangular thin panel supported by the corner module from below at each corner portion and the contact portion of the vibration suppressing body.

5. The rectangular thin panel conveyance unit according to claim 4, wherein
the rectangular thin panel is a solar panel, and
the predetermined clearance is equal to or less than 5 mm.

6. The rectangular thin panel conveyance unit according to claim 3, wherein
the support surface supports the corner portion of the rectangular thin panel as a free end,
the contact portion of the vibration suppressing body that faces the inferior surface of the rectangular thin panel supported by the corner module from below at each corner portion forms an abutment surface in abutment with the inferior surface of the rectangular thin panel, and
the contact portion is disposed so as to be flush with the support surface.

7. The rectangular thin panel conveyance unit according to claim 1, wherein
a concave portion is provided at each end portion of the vibration suppressing body, the concave portion facing outward in the longitudinal direction across a thickness direction of the vibration suppressing body, and
relative movement of the upper vibration suppressing body relative to the lower vibration suppressing body in the width direction is restricted by stretching a band in the concave portions of the stacked vibration suppressing bodies in a C shape when the vibration suppressing bodies are stacked in the vertical direction.

8. The rectangular thin panel conveyance unit according to claim 1, wherein
the width of the vibration suppressing body is determined depending on a proportion of a supported area of the rectangular thin panel to an area of the planar portion of the rectangular thin panel, the weight of the rectangular thin panel, and a configuration where the rectangular thin panel is supported by the corner modules, the supported area being an area supported by the set of the corner modules.

9. The rectangular thin panel conveyance unit according to claim 1, wherein
the vibration suppressing body includes side surface portions, one of the side surface portions having a recess across a thickness direction at a predetermined position in a longitudinal direction to avoid a power distribution box and/or a cord, the power distribution box and/or the cord being attached to stacked solar panels.

10. The rectangular thin panel conveyance unit according to claim 1, wherein
the vibration suppressing body is solid with a plurality of through-holes, the plurality of through-holes extending in a thickness direction,
the vibration suppressing body is an integrally molded foamed resin, and
the vibration suppressing body has an expansion ratio, the expansion ratio being large enough so as not to crack the rectangular thin panel when the rectangular thin panel comes into contact with the vibration suppressing body due to a vibration.

11. The rectangular thin panel conveyance unit according to claim 1, wherein
the vibration suppressing body is constituted by a pair of thermoplastic resin plates,
a side peripheral surface is formed by bonding both peripheral edge portions of the pair of thermoplastic resin plates together, and a hermetic hollow portion is formed inside by the bonding,
the pair of thermoplastic resin plates each have a plurality of recesses on an outer surface, the plurality of recesses being tapered inward while projecting at an inner surface side, the plurality of recesses each have a butt planar portion in a thinnest end portion,
an annular rib is formed by butt welding such that the planar portion of each of the recesses of one of the pair of resin-made plates is welded to the planer portion of the corresponding recess of the other of the pair of resin-made plates in a back-to-back manner, the annular rib extending between the pair of resin-made plates, and
the number and/or a thickness of the annular rib is large enough so as not to crack the rectangular thin panel when the rectangular thin panel comes into contact with the vibration suppressing body due to a vibration.

12. The rectangular thin panel conveyance unit according to claim 1, wherein
the vibration suppressing body has a thickness that is equal to the distance between the inferior surface of the upper rectangular thin panel and the top surface of the lower rectangular thin panel,
the contact portion on the upper side of the vibration suppressing body is in abutment with the inferior surface of the upper rectangular thin panel, and
the contact portion on the lower side of the vibration suppressing body is in abutment with the top surface of the lower rectangular thin panel.

13. The rectangular thin panel conveyance unit according to claim 1, further comprising
a conveyance pallet with a top surface on which a set of the corner modules at the lowest position rest.

14. The rectangular thin panel conveyance unit according to claim 3, wherein
the vibration suppressing bodies are stacked such that a predetermined clearance is provided between the planar portion of the rectangular thin panel supported by the corner module from below at each corner portion and the contact portion of the vibration suppressing body.

15. The rectangular thin panel conveyance unit according to claim 3, wherein
the vibration suppressing body has a thickness that is equal to the distance between the inferior surface of the upper rectangular thin panel and the top surface of the lower rectangular thin panel,
the contact portion on the upper side of the vibration suppressing body is in abutment with the inferior surface of the upper rectangular thin panel, and the contact portion on the lower side of the vibration suppressing body is in abutment with the top surface of the lower rectangular thin panel.

* * * * *